(12) United States Patent
Dietz et al.

(10) Patent No.: US 10,684,323 B2
(45) Date of Patent: Jun. 16, 2020

(54) ASSEMBLY OF STRIP CONDUCTORS, DEVICE, AND METHOD FOR DETERMINING ERRORS IN A SEMICONDUCTOR CIRCUIT

(71) Applicant: Robert Bosch GmbH, Stuttgart (DE)

(72) Inventors: Franz Dietz, Willmandingen (DE); Lichao Teng, Reutlingen (DE); Markus Ost, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 159 days.

(21) Appl. No.: 15/573,505

(22) PCT Filed: May 9, 2016

(86) PCT No.: PCT/EP2016/060288
§ 371 (c)(1),
(2) Date: Jan. 24, 2018

(87) PCT Pub. No.: WO2016/180758
PCT Pub. Date: Nov. 17, 2016

(65) Prior Publication Data
US 2018/0143243 A1   May 24, 2018

(30) Foreign Application Priority Data
May 11, 2015   (DE) .......................... 10 2015 107 301

(51) Int. Cl.
*G01R 31/28* (2006.01)
*G01R 31/3835* (2019.01)

(52) U.S. Cl.
CPC ..... *G01R 31/2858* (2013.01); *G01R 31/2884* (2013.01); *G01R 31/3835* (2019.01)

(58) Field of Classification Search
CPC ............ G01R 31/2858; G01R 31/3835; G01R 31/2884; H01L 22/34
(Continued)

(56) References Cited

U.S. PATENT DOCUMENTS

| 8,890,556 B2 | 11/2014 | Chen |
| 2002/0017906 A1 | 2/2002 | Ho |

(Continued)

FOREIGN PATENT DOCUMENTS

| CN | 102035529 A | 4/2011 |
| DE | 102008000218 A1 | 9/2008 |

OTHER PUBLICATIONS

Morgan et al. "Test Structures for Electromigration Evaluation in Submicron Technology", Proceedings of the 1996 IEEE International Conference on Microelectronic Test Structures, vol. 9, March 1996, pp. 283-287 (Year: 1996).*

(Continued)

*Primary Examiner* — Melissa J Koval
*Assistant Examiner* — Courtney G McDonnough
(74) *Attorney, Agent, or Firm* — Norton Rose Fulbright US LLP; Gerard Messina

(57) ABSTRACT

An assembly of strip conductors for determining errors in a semiconductor circuit, the strip conductors may be situated on a level of the semiconductor circuit. The assembly includes multiple sections, the sections being arranged as a series circuit, each section including a number of strip conductors, the number of strip conductors in the particular sections being different, each section including a start area and an end area, a voltage difference value between the start area and the end area of the particular section being detectable, and the voltage difference values of the particular sections being different in the case of an error.

6 Claims, 3 Drawing Sheets

(58) Field of Classification Search
USPC .............. 324/500, 512, 537, 762.01, 762.02,
324/762.03, 555, 600, 602, 605, 606, 629,
324/647, 649, 691, 705, 76.11, 98
See application file for complete search history.

(56) References Cited

U.S. PATENT DOCUMENTS

| | | |
|---|---|---|
| 2009/0012747 A1 | 1/2009 | Lee |
| 2009/0033351 A1 | 2/2009 | Chanda |
| 2013/0038334 A1 | 2/2013 | Brochu |

OTHER PUBLICATIONS

International Search Report for PCT/EP2016/060288 dated Jul. 5, 2016.
Mitchell, M.A. et al. "Issues with Contact Defect Test Structures," Proceedings of the International Conference on Microelectronic Test Structures (ICMTS), San Diego, Mar. 16-19, 1992, pp. 53-56.

* cited by examiner

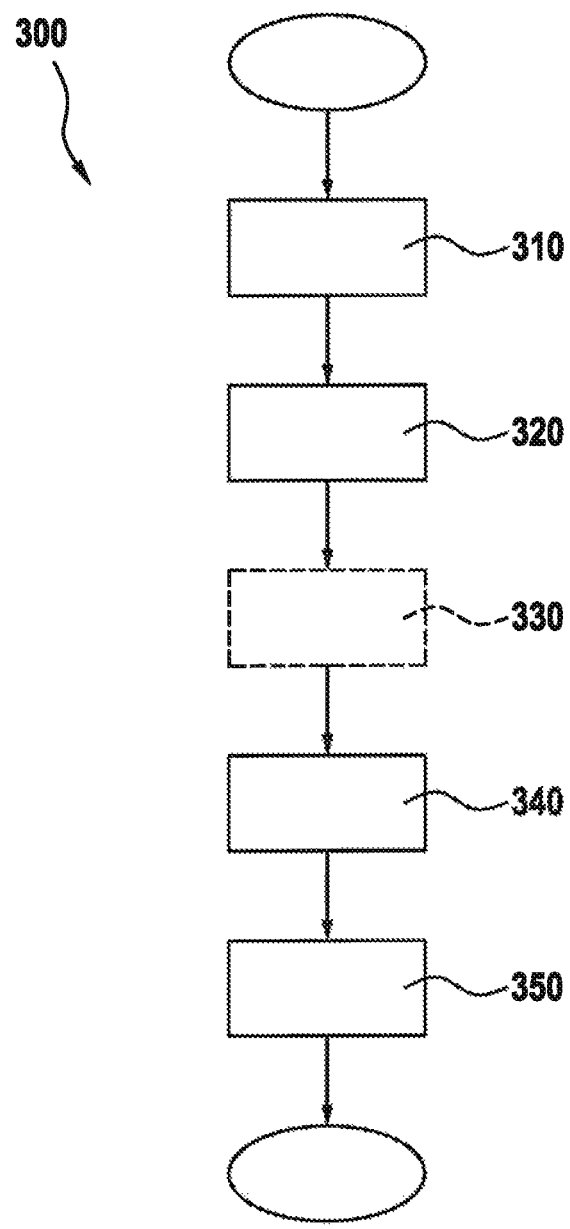

ASSEMBLY OF STRIP CONDUCTORS, DEVICE, AND METHOD FOR DETERMINING ERRORS IN A SEMICONDUCTOR CIRCUIT

FIELD OF THE INVENTION

The present invention relates to an assembly of strip conductors, a device, and a method for determining errors in a semiconductor circuit.

BACKGROUND INFORMATION

Integrated circuits contain a plurality of highly integrated circuit elements that are connected via complex metal plating, for example transistors, resistors, or capacitors. During operation of the integrated circuits, currents flow across the metal plating; due to the small line cross sections, i.e., within connecting points of the metal levels, very high current densities, typically in the range of up to 1 $MA/cm^2$, may occur. This results in a failure mechanism of so-called electromigration. Electrons collide with atoms of the strip conductor, and a pulse transfer takes place that results in a displacement or diffusion of the metal atom in the direction of the electron flow. If this results in a mass flow divergence, cavities form in the strip conductor; i.e., at certain locations in the metal plating, more metal atoms move away than are delivered, for example at grain boundaries or vias, which are made of a different material such as tungsten. It is disadvantageous that the strip conductor breaks off; i.e., the strip conductor is interrupted and the electrical functionality of the ASIC is no longer present. Rising temperature likewise increases the effect of the electromigration. The effect is also significantly dependent on the intrinsic heating of the strip conductor, the signal pattern of the load (with AC currents generating less degradation), the metal used, such as Al, W, Cu, Ti, etc., and its mechanical properties, and the processing parameters of the metal plating, including process errors, and the layout, for example the length and width of the strip conductor.

For determining failure mechanisms, it is known to evaluate the maximum load capacity of the strip conductors, vias, and contacts. Methods and test structures for this purpose are standardized, for example JEDEC standards JESD61, JESD63, and JESD87. Furthermore, simulation of the effect of the electromigration, using the finite elements method, is known. In addition, accelerated test methods and reliability tests are correlated with the conditions of the actual application, for example as described in "Simulation of Electromigration Test Structures with and without Extrusion Monitors," V. Hein, ICSE 2006.

The document DE 10 2008 000 218 A1 discusses an improved test structure having the objective of reducing the corresponding testing times in quick tests.

It is likewise believed to be understood that the design of the strip conductor widths is based on assumptions concerning the actual field load and load capacity of the metal plating. If the actual load is higher or the metal plating is defective, there is the risk of failures despite having passed quality inspection and function testing.

The document U.S. Pat. No. 8,890,556 B2 discusses continuous monitoring of the electromigration in the application, as well as corresponding measuring cycles that are carried out in the ASIC.

Structures from standard testing are based on long-term measurements of individual strip conductors, and at the time of testing detect the most critical dimension of the strip conductor for which the strongest electromigration is present, in order to establish the maximum load capacity. The objective of the qualification is not relative measurement, since such measuring devices may indicate absolute values for the resistance, and absolute values must be indicated for specifying the maximum load capacity.

The qualification tests only a limited quantity of material. Protection is to be provided for the most critical load that occurs in the field, i.e., the maximum current on the most unstable strip conductor at the highest temperature. This results in oversizing; however, unexpected low load capacities, for example due to process fluctuations, or unplanned overloads, for example continuous operation at the load limit, cannot be addressed in a cost-effective manner.

The electromigration is strongly dependent on the strip conductor width, and has the "bamboo effect." Here, the electromigration stability of very thin strip conductors is very high, since statistically, grain boundaries are very often perpendicular to the strip conductor; however, a grain boundary hinders the migration of the metal atoms. In addition, thin strip conductors are well stabilized mechanically by the surrounding dielectrics. In turn, very wide strip conductors provide the current flow with sufficient alternatives on parallel paths in the event of localized degradation.

In this regard, there is an average width, typically in the range of the average grain size, for example 1 µm-3 µm, which represents electromigration that is particularly critical for the failure mechanism. This effect has not been considered thus far in integrated test structures.

The known electromigration structures measured in situ test only one layout variant, and compare its resistance to an unstressed reference element or initial value.

Even if it were conceivable to integrate the structures, mentioned in the document U.S. Pat. No. 8,890,556 B2, multiple times with modified metal plating variants, the space requirements would indeed be disadvantageous.

SUMMARY OF THE INVENTION

An object of the present invention is to ascertain the degradation of the metal plating of the semiconductor circuit.

The assembly of strip conductors according to the present invention for determining errors in a semiconductor circuit includes strip conductors that may be situated on a level of the semiconductor circuit. The term "strip conductor" is understood to mean a printed conductor or a conducting track, i.e., an electrically conductive connection. The assembly includes multiple sections. These sections are arranged as a series connection. Each section includes a number of strip conductors. The number of strip conductors is different in the individual sections. Each section includes a start area and an end area, a voltage difference value between the start area and the end area of the particular section being detectable. If the particular section is connected to another, i.e., preceding, section, the end area of the preceding section at the same time thus represents the start area of the particular section or the section at that moment. In the event of an error, the voltage difference values of the particular sections are different.

The advantage is that a degradation due to electromigration is easily detectable during operation of the semiconductor circuit, even before the occurrence of an error in the semiconductor circuit may be recognized. In addition, it is advantageous that a separate reference structure in addition to the test structure is not necessary, since wide strip conductors degrade much more slowly than strip conductors having a critical width, the so-called "worst-case" width. The width of the strip conductor of the section that includes only one strip conductor may thus be used as a reference. In addition, storing an initial value is thus not absolutely necessary.

In one refinement, the strip conductors of a section have the same length and width and are situated in parallel to one another.

It is advantageous that the current density in the starting state, i.e., at the beginning of the measurement, is constant in sections. Since the current density has a great effect on the electromigration degradation, the degradations of the individual sections may thus be easily compared to one another. In addition, it is advantageous that, due to the various strip conductor widths, the strip conductor width that shows the highest degradation is ascertainable, and the degradation present at that moment is quantifiable.

In one embodiment, the widths of the strip conductors are different, at least in adjoining sections.

It is advantageous that various failure mechanisms are detectable.

In one refinement, the narrowest strip conductor of the assembly has a width that results from a quotient of the widest strip conductor of the assembly and the number of sections.

It is advantageous that during normal operation, i.e., when no errors are present, the same voltage difference value or drop in the voltage difference value is present in each end area of the sections. In other words, the resistance of the individual sections or sectors is approximately identical at least initially, i.e., without degradation, due to the parallel connection of the strip conductors. An applied current thus results in very similar voltage drops or voltage values, which simplifies the evaluation of the voltage difference values significantly. In addition, it is advantageous that the assembly of strip conductors, i.e., the detector or the test structure, includes multiple sectors having different strip conductor widths, since technological variations in the grain size or a change in the most critical strip conductor width, for example due to influences by the manufacturing process, are detected in this way.

In one refinement, each strip conductor includes at least one via in the end area of the section. In other words, multiple vias may be present in the end area of the section. The at least one via electrically connects the strip conductor to another level of the semiconductor circuit. The via is situated perpendicularly between the strip conductor and the other level, so that the voltage value of each strip conductor in the other level is tappable in the sense of being detectable. The vias are electrically connected on or in the other level of the semiconductor circuit with the aid of a metal area, the metal area representing a voltage tap.

The advantage is that the voltage values are also detectable on other levels of the semiconductor circuit, so that, for example, the evaluation may take place on a single level that may possibly be more easily accessible than the level on which the measuring structure or the detector or the test structure, i.e., the assembly of strip conductors, is situated.

The device for determining errors in a semiconductor circuit with an assembly of resistors includes a number of differential amplifiers, a number of comparators, and a control unit. According to the present invention, the resistors are situated in the form of strip conductors. The number of differential amplifiers corresponds to the number of sections. Each differential amplifier generates a voltage difference value, each voltage difference value being associated with one of the comparators as a first input value. A reference value is used as a second input value for the comparators. The control unit detects output values of the comparators, and as a function of the output values generates an output signal which represents the type of error.

The advantage is that a change in the resistance due to electromigration, but also due to other aging effects such as stress migration, results in a different voltage drop at the corresponding section or sector, and thus results in an easily measurable signal.

The method according to the present invention for determining errors in a semiconductor circuit with the aid of an assembly of strip conductors includes the steps of determining voltage difference values for each section of the assembly of strip conductors, detecting a reference value, generating an output signal as a function of the voltage difference values and the reference value, and determining the error as a function of the output signal.

It is advantageous that the method may measure the degradation of the strip conductor or the metal plating during operation of the semiconductor circuit. The variables which have been unknown thus far, such as working temperature, user behavior, and material properties are thus precisely detected and do not have to be estimated.

Further advantages result from the following description of exemplary embodiments and from the dependent patent claims.

The present invention is explained below with reference to specific embodiments and the appended drawings.

BRIEF DESCRIPTION OF THE DRAWINGS

FIG. 3 shows a method for determining errors in the semiconductor circuit.

DETAILED DESCRIPTION

Figure 1:
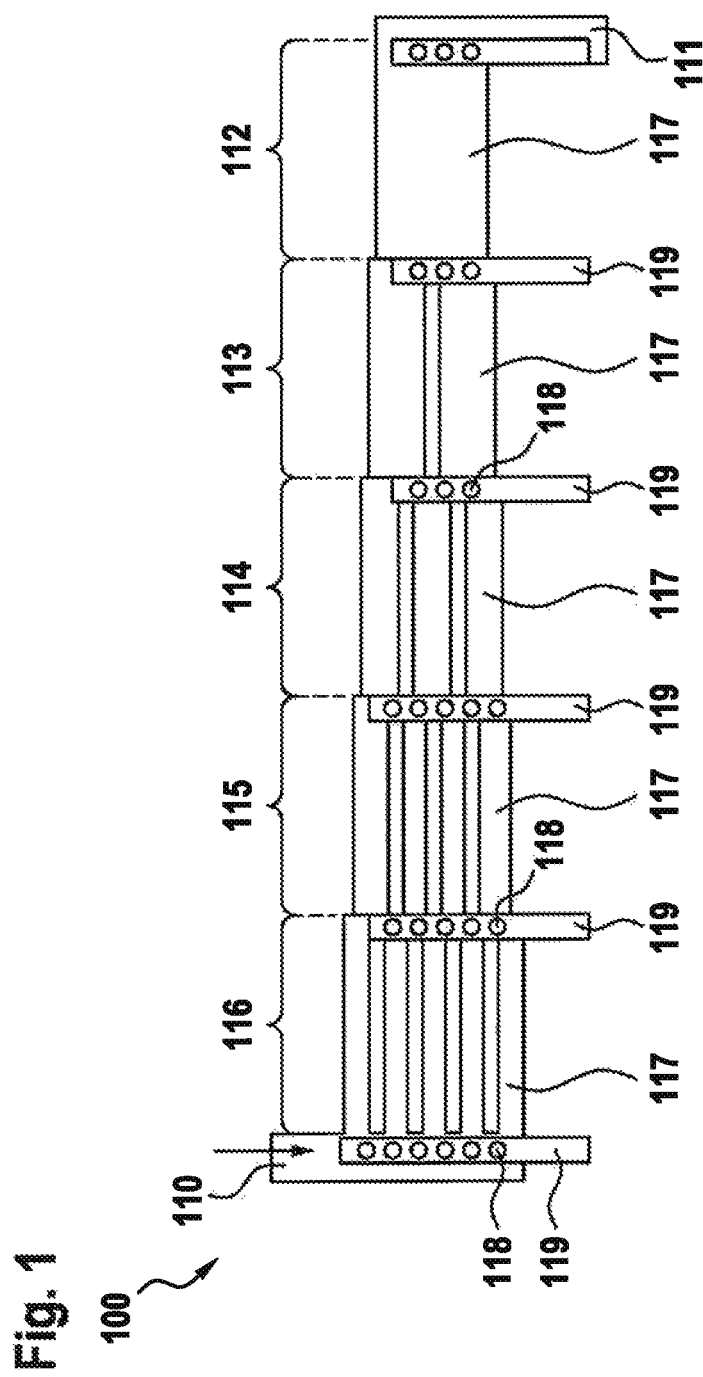
FIG. 1 shows an assembly of strip conductors for determining errors in a semiconductor circuit.

FIG. 1 shows an assembly 100 of strip conductors 117 for determining errors in a semiconductor circuit. Assembly 100 includes by way of example five sections 112, 113, 114, 115, 116 that are situated on a horizontal level of the semiconductor substrate. Sections 112, 113, 114, 115, 116 are connected in series. Each section 112, 113, 114, 115, 116 includes a certain number of strip conductors 117. A section 112, 113, 114, 115, 116 includes at least one strip conductor 117. If a section 112, 113, 114, 115, 116 includes more than one strip conductor 117, the strip conductors 117 in this section 112, 113, 114, 115, 116 are situated in parallel to one another. Assembly 100 includes a first feed line 110 and a second feed line 111. First feed line 110 is electrically connected to section 116 of assembly 100, which includes the largest number of strip conductors 117. Second feed line 111 is electrically connected to section 112 of assembly 100, which includes a single strip conductor 117.

A first voltage potential may be applied or connected to first feed line 110, and a second voltage potential may be applied or connected to second feed line 111. The first voltage potential is different from the second voltage potential. The second voltage potential may optionally be connected to ground.

Strip conductors 117 in a section 112, 113, 114, 115, 116 or within a section 112, 113, 114, 115, 116 each have the same width. In other words, in a section or sector all metal printed conductors have the same width, the sum of the widths for each sector being approximately identical. Since the width of the strip conductor influences the resistance of the strip conductor, slight corrections to the width may possibly be necessary, with the aim of compensating for the boundary portion of the resistance value. In addition, identical resistance values for each sector may be ensured. If the assembly of strip conductors, also referred to here as a detector, is acted on by current in the application, this results in very similar voltage drops, with a difference <<5%, corresponding to the resistances.

Al, Cu, W, Co, Ta, TaN, Ti, TiN, or layered combinations thereof are used as typical materials of the strip conductors. Highly doped or silicided polyconductors such as TiSi and CoSi having sheet resistances of less than 50 ohm/square are utilized as metallic compounds. The layer thickness of these metals is typically in the range of 100 nm to 10 µm.

In the end area, each section 112, 113, 114, 115, 116 includes a metal area 119 that functions as a voltage tap. The end area of the preceding section at the same time is the start area of the section that follows. Section 116, which includes the most strip conductors situated in parallel, also includes a metal area 119 in the start area of section 116 which functions as a voltage tap.

In one exemplary embodiment, the width of narrowest strip conductor 117 results from the quotient of widest strip conductor 117 and the number of sections 112, 113, 114, 115, 116. The width of the narrowest strip conductor represents the "worst-case" dimension of the strip conductor. The minimum structure width of the metals or strip conductors 117 is in the range of less than 2 µm, depending on the technology node and the metal level.

In another exemplary embodiment, the width of narrowest strip conductor 117 is defined via the minimum structure width of the technology, and is in the range of less than 2 µm, depending on the technology node and the metal level. The number of strip conductors in a section 112, 113, 114, 115, 116 results from the quotient of widest strip conductor 117 and the strip conductor width in the particular section 112, 113, 114, 115, 116. The width of the "worst-case" dimension of strip conductors 117 is typically larger than the minimum strip conductor dimension, and is in the range between 2 µm and 8 µm, depending on the technology node and the metal level. This means that assembly 100 includes at least one strip conductor within the range of the minimum strip conductor width, and at least one strip conductor within the range of the strip conductor width ≥10 µm. For eight sections, for example the following values of the strip conductors in the individual sections are used: 0.21 µm, 0.28 µm, 0.35 µm, 0.5 µm, 1.0 µm, 2.0 µm, 4.0 µm, 10.0 µm.

In another exemplary embodiment, the assembly of strip conductors 117 or the detector includes a number of N sections or sectors, each sector i, where 1≤i≤N, including N−i+1 metal resistors connected in parallel and having a width of W=N/(N−i+1).

In another exemplary embodiment, assembly 100 includes intermediate metal connections, so-called vias 118. Vias 118 function as electrical connections between various metal levels of the semiconductor circuit, which in particular are vertically situated. Vias 118 are situated on assembly 100 in the end area of sections 112, 113, 114, 115, 116, each strip conductor 117 including at least one via 118. Each via 118 has essentially the shape of a cylinder. Vias 118 are essentially perpendicular to strip conductors 117 and electrically connected to same. In addition, vias 118 are situated in the start area of section 116 which includes the most strip conductors 117. Vias 118 allow an electrical connection of strip conductors 117 to another or a different level of the semiconductor circuit on which, for example, they are more easily accessible for further processing. Vias 118 of a section 112, 113, 114, 115, 116 are electrically connected to one another on the other level with the aid of a metal area 119. These metal areas 119 function as a voltage tap.

In another exemplary embodiment, the other level is situated below assembly 100, within the semiconductor substrate, so that vias 118 are situated below strip conductors 117, and vias 118 electrically contact strip conductors 117 from below.

In other words, a plurality of components and circuit blocks are situated in a semiconductor circuit or on an ASIC or an integrated circuit, and are connected via contacts to a metal plating situated thereabove with the aid of intermediate metal connections. Overall, multiple, up to ten, metal plating levels exist which may be electrically connected to one another with the aid of vias 118. One or multiple metal degradation detectors may thus be placed on an ASIC. The metal degradation detectors are understood to mean the assembly of strip conductors according to the present invention. A separate detector would typically be integrated for each metal plating level used. At the end of each sector, a voltage tap is inserted for the sector, for example in the same metal level into which the detector is integrated.

In another exemplary embodiment, contacting is provided by metal levels situated above or below, with the aid of intermediate metal connections, the vias. Alternatively, a direct connection of the voltage taps to a semiconductor situated below the detector may be established. This is advantageous when the assembly of strip conductors or the detector is situated in the first metal level, since the detector may thus be situated in a space-saving manner.

It is also noted that the assembly of strip conductors is not limited to five sections. The assembly of strip conductors may include an arbitrary number of sections or sectors.

In another exemplary embodiment, assemblies of strip conductors or detectors with a different number of sections are situated on different metal levels of the semiconductor circuit. In other words, similar detectors for various metal layers are placed one above the other.

In another exemplary embodiment, a PN transition is introduced into the underlying semiconductor. The forward voltage of the semiconductor may thus be utilized for precise temperature monitoring. The temperature of the strip conductors may be determined in this way. With the additional information concerning the voltage drop at the strip conductors, a resistance value at the premeasurement temperature may be deduced. The resistance value at the premeasurement temperature may thus be determined and stored as a reference value.

In another exemplary embodiment, further strip conductors which are not in direct metallic connection with the actual detector are introduced between or next to the individual metal resistors. These further strip conductors form a shared electrical network which is connected to an evaluation circuit that is integrated into the ASIC. The circuit is thus able to detect a short circuit in the network with respect to the detector, for example by monitoring the potential of this network, which typically would be connected to ground, but which in the event of a short circuit assumes the potential of the detector. Such networks are known as "extrusion monitors" in the qualification standards and in conventional testing. When the strip conductors that are connected to the detector are electrically connected to at least two points, their resistance may be detected, and on this basis the temperature, for example, may be deduced, for example according to the empirical formula $R(T)=R_{25°C}*(1+(T-$ $25°)*TCR_1+(T-25°)^2*TCR_2)$, where $TCR_1$, $TCR_2$ are temperature coefficients, T is the strip conductor temperature, and $R_{25° C}$ is the resistance at the reference temperature of 25° C. $TCR_1$ is typically the proportionality constant of the linear portion, and $TCR_2$ is the proportionality constant of the quadratic portion.

Figure 2:
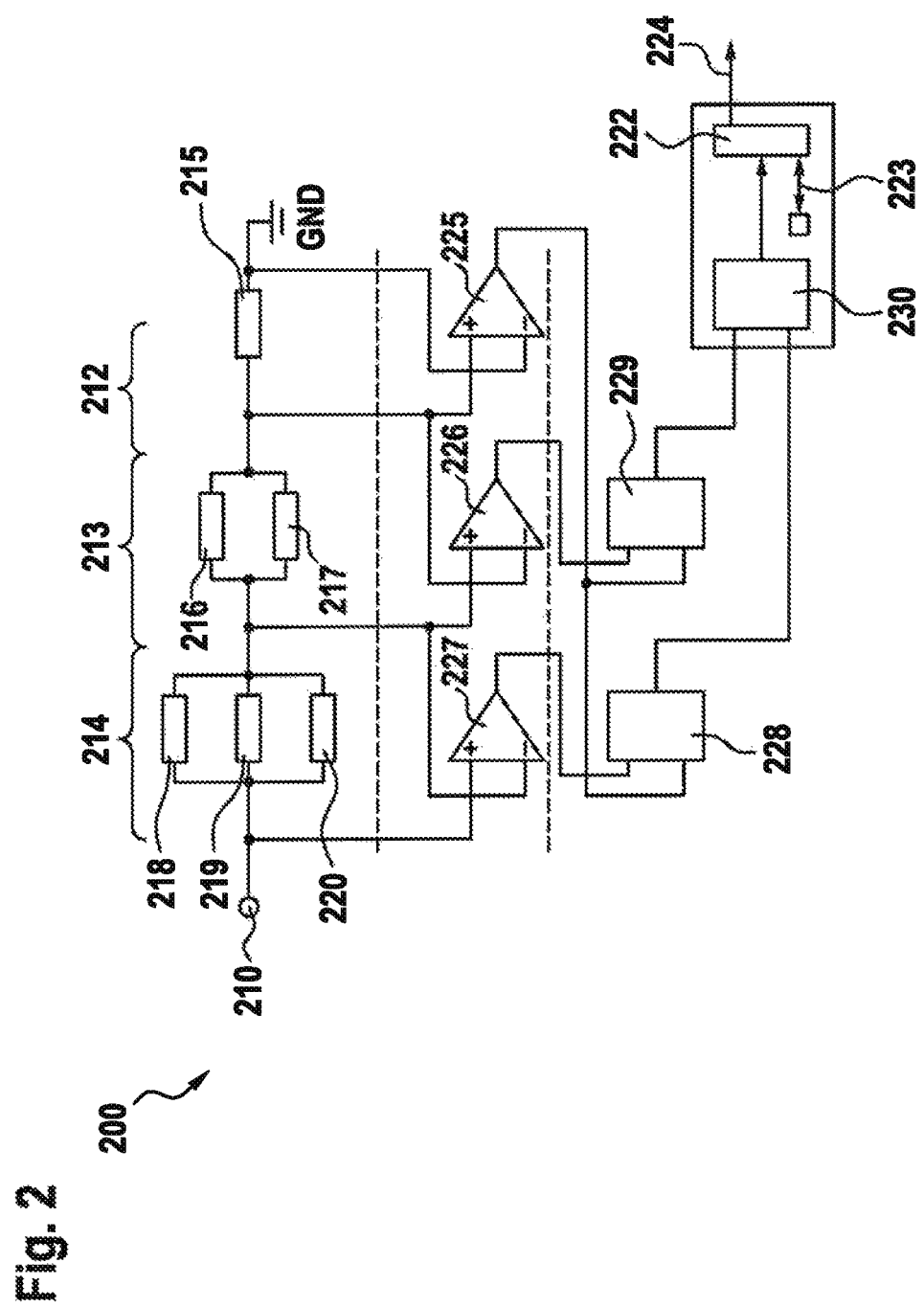
FIG. 2 shows an equivalent circuit diagram of a device for determining errors in the semiconductor circuit.

FIG. 2 shows an equivalent circuit diagram of a device 200 for determining errors in a semiconductor circuit. Device 200 includes three sections 212, 213, 214 by way of example, which are connected in series. In other words, the device includes sectors of metal resistors connected in series. Each section 212, 213, 214 includes a certain number of resistors 215, 216, 217, 218, 219, 220. The resistors are situated in parallel to one another in the particular or individual sections. Device 200 includes a first feed line 210 that is connected to section 214, which includes the most resistors 218, 219, 220 connected in parallel. Device 200 includes a second feed line 211 that is connected to section 212, which includes a single resistor 215. Device 200 includes a number of differential amplifiers 225, 226, 227 that correspond to the number of sections 212, 213, 214. First feed line 210 is connectable or connected to a first voltage potential, and second feed line 211 is connectable or connected to a second voltage potential. The second voltage potential is usually the electrical ground. The positive input of each differential amplifier 225, 226, 227 is connected to the output of the preceding section connected in series. If this is differential amplifier 227 that is associated with section 214, with the most strip conductors situated in parallel, the positive input of differential amplifier 227 is electrically connected to first feed line 210. The negative input of each differential amplifier is connected to the output of section 214. If this is differential amplifier 225 that is associated with section 212, i.e., the section with a single resistor 215, the negative input of the differential amplifier is connected to ground. Device 200 includes comparators 228 and 229, which are electrically conductively connected to the outputs of the differential amplifiers. Device 200 includes a control unit 221 with an OR gate 230, a microcontroller 222, and a memory 223. Control unit 221 is electrically connected on the input side to the outputs of comparators 228 and 229; i.e., control unit 221 detects the output signals of comparators 228 and 229. Control unit 221 generates a signal 224, i.e., the detector signal, which indicates the type of error, as a function of the output signals of comparators 228 and 229 with the aid of OR gate 230 and microcontroller 222. This means that the failure mechanism of the semiconductor circuit may be deduced from signal 224, also referred to as the detector signal. A distinction is made between the failure mechanisms of the electromigration, the stress migration, and the undercutting of strip conductors.

FIG. 3 shows the method for determining errors in a semiconductor circuit. The method starts with step 310, in which each differential voltage amplifier detects a first voltage value in a start area of the particular section as the first input value, and detects a second voltage value in the end area of the particular section as the second input value, in order to ascertain therefrom a voltage difference value and optionally amplify same. For detecting the voltage difference values, a measuring current is applied to the assembly of strip conductors; i.e., a current flows in the assembly of strip conductors. In other words, a current flows across the detector. It is thus possible to detect the voltage drop across the individual sectors with corresponding differential amplifiers. Since the resistance values of the sections have a similar or identical resistance value, similar or identical differential voltages result, at least at the start of the measurement, for current flow in series through the sections. "Similar or identical differential voltages" means that no error is present. A reference value is detected in a subsequent step 320. The voltage difference value of a nondegrading section of the resistance arrangement is generally detected as the reference value. The section with the widest strip conductor may be used for ascertaining the reference value. Alternatively, the voltage difference value, which drops across a strip conductor having physical holes in the metal so that the material transport is impeded, may also be used as the reference value. A stable reference value may be generated in this way. Further voltage difference values are detected in an optional step 330. For each section of the assembly of strip conductors, the associated voltage difference value that drops across the particular section is detected. The individual voltage difference values are compared to the reference voltage value with the aid of comparators, in particular window comparators. The control unit detects the output values of the individual comparators in a subsequent step 340. The output values are compared with the aid of the OR gate, and as a function of the output values an output signal is generated which indicates whether the voltage difference value of one of the sections, compared to the voltage difference value of the nondegrading section, has exceeded a settable tolerance threshold. An error is determined as a function of the output signal in a subsequent step 350. In other words, the failure mechanism may be deduced from the detector signal.

For this purpose, the output signal of the OR gate is supplied to control unit 221, which includes an analog evaluation circuit, or a microcontroller 222 as a digital evaluation circuit.

In one refinement, control unit 221 may also be configured in such a way that the signals of all window comparators for the individual sections are evaluated according to fairly complex logic systems, for example as a linkage of the signals according to their strip conductor dimensions. Thus, a marked change in sections with strip conductors of average width may be an indication of electromigration, while the degradation of particularly narrow strip conductors indicates undercutting during the processing, or stress migration.

In one refinement, the control unit includes a nonvolatile memory 223, so that voltage difference values, for example the voltage difference values during an initial measurement, may be stored at different points in time.

In the failure mechanism of electromigration, primarily the section with strip conductors having an average width has a change in resistance; i.e., the voltage drop or the voltage difference is significantly greater than the voltage difference for the section with the widest strip conductor. The section with the widest strip conductor may be used as the reference voltage.

In the failure mechanism of stress migration, the voltage difference in the sections having the minimum width of the strip conductors is greater than the reference voltage difference.

The failure mechanism of undercutting of the strip conductors typically has a particularly strong influence on the structures with minimum width, but is still applied in the manufacturing process and, depending on the characteristic, may already be recognized during an initial measurement.

In one exemplary embodiment, the maximum voltage difference between the individual sections is detected as the detector signal, the maximum voltage difference being a measure for the greatest change in resistance or deviation in resistance in the sections.

Alternatively, in particular for digital processing of the voltage values, the sector with the strongest degradation is ascertained as the detector signal and is output.

In another exemplary embodiment, the detector signal is back-calculated via the instantaneous temperature of the detector to standardized temperature and measurement conditions. The temperature of the detector may be ascertained as described above from other metal resistors or via integrated temperature diodes, with the aid of the temperature-dependent resistance formula. The ascertained voltage drop may be subsequently compared to a comparison value stored in nonvolatile memory 223, so that the absolute degradation of the semiconductor circuit since the manufacturing date may be determined. The stored comparison value is typically detected at final inspection or during premeasurement of the ASIC, for example with the aid of the functionality test for the semiconductor circuit. An initial or comparison value or reference value is thus stored in the nonvolatile memory.

The initial value of the section having a minimum strip conductor width represents a value of interest. It is strongly correlated with the metal width of the minimum strip conductor. This metal width is used in minimum metal resistors, as utilized in an analog circuit.

The information concerning this strip conductor width may be used during the function testing in order to calibrate corresponding analog circuits. In addition, the exact determination of the metal resistance is limiting for the timing in integrated logic systems, since if the strip conductors are too narrow, the resistance increases and signal propagation times increase to the point that the logic system of the ASIC no longer functions. Knowledge of this strip conductor width thus provides the option for reducing the maximum allowed clock pulse of the circuit, or for taking other measures, such as increasing the internal supply voltage, in order to still achieve the specified clock pulse.

A typical current is conducted through the detector during operation of the semiconductor circuit. This may be a direct current, which, for example, reflects the nominal allowable current for the overall width, or which is intentionally applied at a higher level to ensure triggering of the detector before functional problems occur in the ASIC. Alternatively, a pulsed current is applied if this more precisely represents the conditions in the circuit. The current may be generated from a specific circuit block, for example a DC-DC converter, to minimize power loss of the detector during operation. The detector signal is ascertained continuously with appropriate filtering, for example average value formation and plausibility checks, to ensure that only meaningfully measured detector signals are used for the evaluation. For this purpose, for example during the evaluation of the detector and prior to the triggering of an error signal, a check is made whether a sufficient current was actually applied through the detector during the measuring operation.

The evaluation of the detector or the evaluation of the assembly of strip conductors may take place at various points in time: initially during the wafer test, and also to check the functioning of the structure and store an initial value as a reference value, after the packaging process in the final test step to check the effect of the packaging process, or in the field, i.e., during operation of the semiconductor circuit, upon each start-up procedure or for safety-critical applications, and also continuously during operation.

There are various possible responses to the detector signal by a higher-level ASIC system in which the semiconductor circuit is embedded. For example, a comparison to a maximum specification, such as a maximum deviation of 20% of the individual sectors, is carried out.

The maximum specification is used as a settable tolerance threshold or threshold value. If this tolerance threshold or threshold value is exceeded, a report is sent to the ASIC system or the higher-level controller. Alternatively, a general transmission of the detector signal to the ASIC system or the higher-level controller takes place which, based on the data of the degradation monitor, optionally in combination with other degradation detectors, may recalibrate the ASIC system and keep it functional, at least to a limited extent.

What is claimed is:

1. An assembly of strip conductors for determining errors in a semiconductor circuit, the strip conductors being situated on a level of the semiconductor circuit, comprising:
    multiple sections, the sections being arranged as a series circuit;
    wherein each of the sections includes a number of strip conductors,
    wherein the number of strip conductors in the particular sections are different,
    wherein each of the sections includes a start area and an end area, a voltage difference value between the start area and the end area of the particular section being detectable, and the voltage difference values of the particular sections being different in the case of an error, and
    wherein the widths of the strip conductors are different, at least in adjoining sections.

2. The of claim 1, wherein the strip conductors of each section have the same length and width and are situated in parallel to one another.

3. An assembly of strip conductors for determining errors in a semiconductor circuit, the strip conductors being situated on a level of the semiconductor circuit, comprising:
    multiple sections, the sections being arranged as a series circuit;
    wherein each of the sections includes a number of strip conductors,
    wherein the number of strip conductors in the particular sections are different,
    wherein each of the sections includes a start area and an end area, a voltage difference value between the start area and the end area of the particular section being detectable, and the voltage difference values of the particular sections being different in the case of an error, and,
    wherein the narrowest strip conductor of the assembly has a width that results from a quotient of the widest strip conductor and the number of the sections.

4. An assembly of strip conductors for determining errors in a semiconductor circuit, the strip conductors being situated on a level of the semiconductor circuit, comprising:
    multiple sections, the sections being arranged as a series circuit;
    wherein each of the sections includes a number of strip conductors,
    wherein the number of strip conductors in the particular sections are different,
    wherein each of the sections includes a start area and an end area, a voltage difference value between the start area and the end area of the particular section being detectable, and the voltage difference values of the particular sections being different in the case of an error, and
    wherein each strip conductor includes at least one via in the end area of the particular section, the via electrically connecting the strip conductor to another level of the semiconductor circuit, perpendicularly, so that the voltage difference value of each section in the other level of the semiconductor circuit is detectable, the vias being electrically connected to a metal area on the other level, and the metal area representing a voltage tap.

5. A device for determining errors in a semiconductor circuit, comprising:
an assembly of resistors, a number of differential amplifiers, a number of comparators, and a control unit;
wherein the resistors are situated in the form of strip conductors, the number of differential amplifiers corresponding to the number of sections, each of the differential amplifiers generating a voltage difference value, each voltage difference value being associated with one of the comparators as a first input value, a reference value being associated with the comparators as a second input value, and the control unit detecting output values of the comparators, and as a function of the output values of the comparators generating an output signal which represents the type of error,
wherein the strip conductors are for determining errors in a semiconductor circuit, including:
multiple sections, the sections being arranged as a series circuit;
wherein each of the sections includes a number of the strip conductors,
wherein the number of strip conductors in the particular sections are different, and
wherein each of the sections includes a start area and an end area, a voltage difference value between the start area and the end area of the particular section being detectable, and the voltage difference values of the particular sections being different in the case of an error.

6. A method for determining errors in a semiconductor circuit with the aid of an assembly of strip conductors, the method comprising:
determining voltage difference values for each of multiple sections of the assembly of strip conductors;
detecting a reference value;
generating an output signal as a function of voltage difference values and a reference value; and
determining an error as a function of an output signal;
wherein the assembly includes the multiple sections, the sections being arranged as a series circuit, each of the sections including a number of strip conductors, the number of strip conductors in the particular sections being different, and each of the sections including a start area and an end area, a voltage difference value between the start area and the end area of the particular section being detectable, and the voltage difference values of the particular sections being different in the case of an error.

* * * * *